(12) United States Patent
Coskun

(10) Patent No.: US 10,809,637 B1
(45) Date of Patent: Oct. 20, 2020

(54) LEARNING BASED DIGITAL CORRECTIONS TO COMPENSATE VARIATIONS ON LITHOGRAPHY SYSTEMS WITH MULTIPLE IMAGING UNITS

(71) Applicant: Applied Materials, Inc., Santa Clara, CA (US)

(72) Inventor: Tamer Coskun, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/426,458

(22) Filed: May 30, 2019

(51) Int. Cl.
| H01L 21/00 | (2006.01) |
| G03F 9/00 | (2006.01) |
| H01L 21/66 | (2006.01) |
| G06T 7/00 | (2017.01) |

(52) U.S. Cl.
CPC .......... *G03F 9/7088* (2013.01); *G03F 9/7076* (2013.01); *G06T 7/0004* (2013.01); *H01L 22/20* (2013.01); *G06T 2207/30148* (2013.01)

(58) Field of Classification Search
CPC ..... H01L 21/28123; H01L 2223/54453; H01L 21/0274
USPC .......................... 438/460, 462; 257/797, 798
See application file for complete search history.

(56) References Cited

U.S. PATENT DOCUMENTS

| 9,543,224 B1* | 1/2017 | Meyer ..................... H01L 22/12 |
| 10,599,055 B1* | 3/2020 | Coskun ............... G03F 7/70483 |
| 2007/0072099 A1 | 3/2007 | Sullivan et al. |
| 2011/0069293 A1* | 3/2011 | Hol ..................... G03F 7/70758 355/67 |
| 2011/0116064 A1 | 5/2011 | Ahn et al. |
| 2015/0261099 A1 | 9/2015 | Yamanaka |
| 2017/0357153 A1 | 12/2017 | Platzgummer |
| 2018/0373161 A1 | 12/2018 | Coskun et al. |
| 2019/0019769 A1 | 1/2019 | Coskun et al. |
| 2019/0369499 A1* | 12/2019 | Lai ..................... G03F 7/70291 |
| 2020/0022577 A1* | 1/2020 | Rishoni ................. A61B 3/113 |
| 2020/0159132 A1* | 5/2020 | Hollerbach ......... G03F 7/70991 |

OTHER PUBLICATIONS

PCT Notification of Transmittal of the international Search Report and the Written Opinion of the International Searching Authority for International Application No. PCT/US2020/030470; dated Aug. 14, 2020; 11 total pages,

* cited by examiner

*Primary Examiner* — S. V. Clark
(74) *Attorney, Agent, or Firm* — Patterson + Sheridan LLP

(57) ABSTRACT

In one embodiment, a method for creating a forecasting model for a multiple-imaging unit DLT is disclosed. A stage of the DLT is positioned so that a set of alignment marks provided on a substrate are placed under a set of the DLT's eyes. For each alignment mark in the set, a first image is acquired using a camera coupled to the eye above it at a first time, and a first position of the alignment mark is obtained within the camera's FOV from the first image, to determine a first measured position. One or more additional images of the alignment mark are subsequently obtained at subsequent times, and one or more corresponding subsequent measured positions are determined. Differences between sequential ones of the measured positions are respectively calculated, a forecasting model to correct for eye center drift of the set of eyes is created, and corrections digitally applied.

20 Claims, 12 Drawing Sheets

LEARNING BASED DIGITAL CORRECTIONS TO COMPENSATE VARIATIONS ON LITHOGRAPHY SYSTEMS WITH MULTIPLE IMAGING UNITS

BACKGROUND

Field

Embodiments of the present disclosure generally relate to the field of maskless lithography, and more specifically to learning based digital corrections to compensate for variations in imaging unit positions in multiple imaging unit digital lithography tools (DLTs).

Description of the Related Art

Microlithography techniques are generally employed to create electrical features on a substrate. A light-sensitive photoresist is typically applied to at least one surface of the substrate. In maskless photolithography a pattern generator exposes selected areas of the light-sensitive photoresist as part of a pattern. The light causes chemical changes to the photoresist in the selected areas to prepare these selected areas for subsequent material removal and/or material addition processes to create electrical features. The precise placement of the electrical features upon the substrate determines the quality of the electrical interconnections.

In multiple imaging unit DLTs, imaging units (known as "eyes") are used to impart patterns to a substrate, where each eye prints on one region of the substrate. The imaging units are held fixed while, for example, a stage is moved beneath them. The imaging units may be assembled on a single cross bar, known as a "bridge", or, for example, on multiple bridges. Each eye prints to a specific print region. By printing from all of the eyes at once, different (or identical, if desired) patterns are created in each of the print regions of a substrate. To make sure that each eye prints only in its printing region, the imaging units need to stay together as a single unit, with a constant distance between eyes on a bridge, and, for multiple bridge systems, a constant distance between the bridges along their respective lengths. These constraints are often both mechanically and thermally challenging, and, as a result, an imaging unit may drift from its nominal position due to either eye or bridge position drift with respect to the stage's co-ordinate system. This drift could be also an effective drift due to drift on the positional measurement system such as encoder due to thermal effects.

Monitoring data for such multiple imaging unit systems has shown that the location of an eye on a bridge changes over time, which may be due to thermal effects and/or mechanically drifting parts. Therefore, there is a need in the art to compensate for this imaging unit drift.

SUMMARY

Embodiments of the present disclosure generally relate to digitally compensating or correcting for imaging unit (eye) drift prior to a scan DLTs including multiple imaging units.

In one embodiment, a method for creating a forecasting model is disclosed. A stage of a multiple-imaging unit digital lithography tool (DLT) is positioned so that a set of alignment marks provided on a substrate coupled to the stage are placed under a set of eyes of the DLT. For each alignment mark in the set, a first image is acquired using a camera coupled to the eye above it at a first time, and a first position of the alignment mark is obtained within the camera's FOV from the first image, to determine a first measured position. One or more additional images of the alignment mark are subsequently obtained at subsequent times, and one or more corresponding subsequent measured positions are determined. Differences between sequential ones of the measured positions are respectively calculated, and, based at least in part on the calculated differences, a forecasting model to correct eye center drift for the set of eyes is created.

In another embodiment, prior to the beginning of each scan of the DLT, the forecasting model is used to apply a digital correction to patterns to be printed in the scan.

In another embodiment, a method for creating a model for a set of imaging units of a multi-imaging unit DLT is disclosed. A substrate is positioned to place a set of alignment marks of the substrate under a set of eyes of a multi-imaging unit DLT. For each alignment mark in the set, an image of the alignment mark is acquired using a camera coupled to the eye above it, a position of the alignment mark within the camera's field of view (FOV) is obtained to determine its measured position, and a difference between its measured position and its nominal position is calculated. Based, at least in part, on the differences, an optimized alignment model is created to transform nominal positons of the alignment marks to their measured positions.

In another embodiment, a system includes a processor and a memory. The memory includes an application program configured to perform an operation for outputting a forecast of eye center variation for an eye of a multiple imaging unit DLT based on historical data. The operation includes obtaining historical eye center variation data for the eye for N most recent printed plates, inputting the historical eye center variation data into a forecasting model for the DLT, receiving, as an output of the model, a correction forecast for the eye, and applying the correction forecast for the eye to a printing region of the eye in a currently printing plate of the DLT.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of this disclosure. As will be apparent to those skilled in the art, however, various changes using different configurations may be made without departing from the scope of this material. In other instances, well-known features have not been described in order to avoid obscuring this material. Thus, this disclosure is not considered limited to the particular illustrative embodiments shown in the specification and all such alternate embodiments are intended to be included in the scope of the appended claims.

Figure 1:
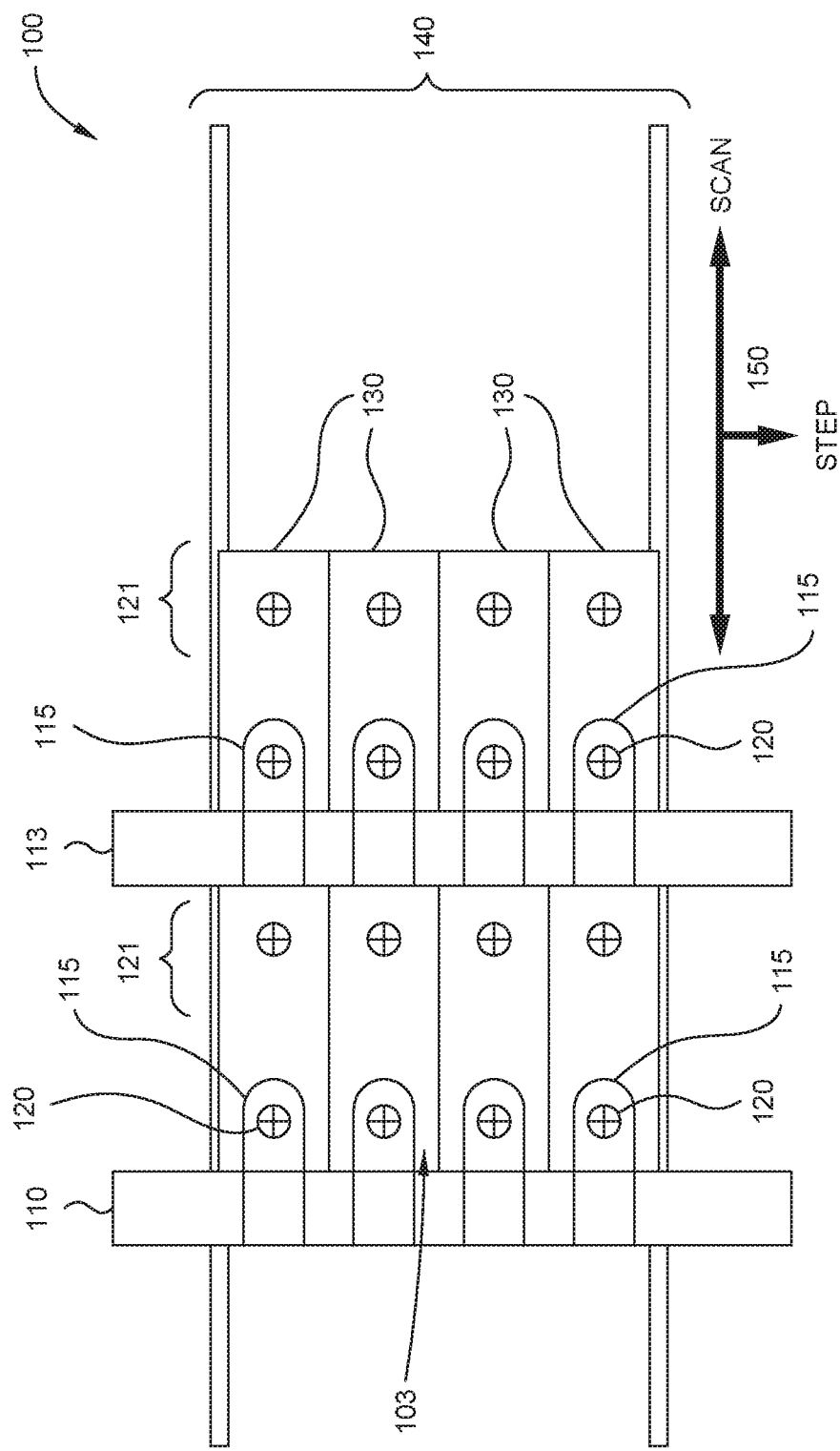
FIG. 1 depicts an example DLT with multiple imaging units in accordance with embodiments disclosed herein.

FIG. 1 illustrates digital alignment in an example multiple imaging-unit DLT 100. System 100 has multiple imaging units 115 (known as "eyes"), which are used to print lithographic patterns on substrate 103 using a light source (not shown). Substrate 103 is shown shaded in FIG. 1, and the portion of eyes 115 above substrate 103 are shown as transparent. In DLT 100, multiple imaging units 115 are fixed, and substrate 103 is placed on and affixed to a moveable stage 140, which moves substrate 103 vertically and horizontally to print the patterns, as shown by two-dimensional arrow 150.

Continuing with reference to FIG. 1, eyes 115 are mounted on each of two vertical bars (known as bridges) 110 and 113, respectively. In this example DLT each bridge is provided with four eyes. Bridges 110 and 113 are mounted above substrate 103, and each of the eight eyes defines an eye printing region 130 on the substrate below. To insure that eyes 115 are properly aligned with respect to substrate 103, substrate 103 is provided with two alignment marks 120, 121 in each printing region 130. These are shown as alignment marks 120 on a left side of each printing region 130, and alignment marks 121 shown on a right side of each printing region 130. As shown, at the depicted positions of bridges 110 and 113, alignment marks 120 are under eyes 115 of bridges 110 and 113, respectively.

Alignment marks 120 and 121 have known positions in the co-ordinate system of stage 140, to which substrate 103 is attached. Thus, by acquiring images of alignment marks 120 and 121 using eyes 115, and determining their position within the acquired images, the position of eyes 115 of DLT 100 is specified relative to the co-ordinate system of stage 140. In this way eye positions are calibrated with respect to the stage, and also calibrated with respect to each other. However, as noted above, over time, in what is believed to be due to thermal conditions and/or mechanical changes, such as, for example, drifting parts, eye locations on each bridge are observed as changing in time. In embodiments, these changes in eye position are tracked, and digitally compensated for. To do this, as shown in FIG. 1, stage 140 moves to designed mark locations so that alignment marks 120 are positioned under eyes 115. Eyes 115, using a coupled camera, take a picture of the alignment marks respectively placed beneath them. The process is repeated for alignment marks 121.

It is noted that in some embodiments, in order to minimize alignment time, if the number of alignment marks per eye is limited to two marks, all of the marks may be captured in two steps. For example, continuing with reference to FIG. 1, in a first step marks 120 (for each of bridges 110 and 113) may be respectively all captured in parallel. Then in a second step, all of marks 121 may then be captured. If more alignment marks are added per eye, then additional alignment steps would be added as well, each of which involves stage movement and adds time.

Figure 2:
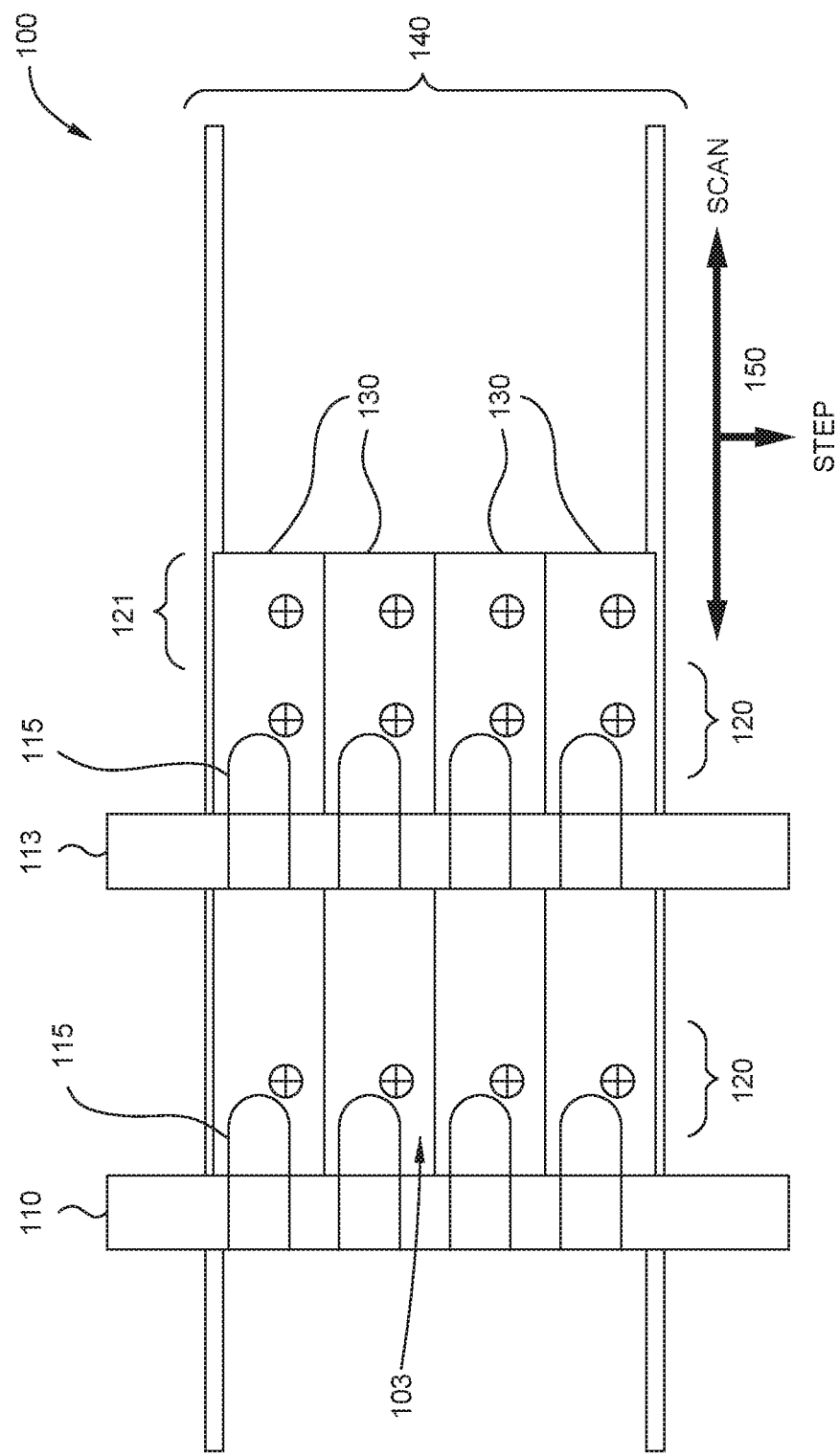
FIG. 2 depicts the example DLT of FIG. 1 at the beginning of a printing run in accordance with embodiments disclosed herein.

FIG. 2 depicts the example DLT of FIG. 1 at the beginning of a printing run in accordance with embodiments disclosed herein. The only difference between FIGS. 1 and 2 is in the position of the eyes 115 relative to substrate 103, which, in FIG. 2, is arranged to begin a printing run, and thus eyes 115 are positioned at the top left of their respective printing regions 130. In an embodiment, with reference to arrow 150, when printing from an eye 115 onto a printing region 130 of substrate 103, stage 140 moves rightward in the horizontal direction, referred to as a "scan", until the eye is at the right end of its printing region 130. At that point stage 140 stops, moves downward an incremental distance in the vertical direction, known as a "step", and then moves back leftward in the horizontal direction, in another scan, until eye 115 is placed once again at the left end of its printing region 130. The pattern is printed via this serpentine motion of scans and steps. The motion of stage 140 is fixed, regardless of any alignment corrections. In an embodiment, corrections for misalignment are made digitally, where prior to the beginning of each print run a global digital correction is applied to the patterns to be printed based on global alignment models, which are generated as described in detail below. In an embodiment, additional eye-specific linear positional corrections or other local digital corrections are also applied when scanning.

It is here noted that in the example DLT 100 of FIGS. 1 and 2, and in the example digital lithography tools depicted in each of FIGS. 3, 4, 6 and 8, the eyes, bridges, alignment marks and eye printing region configurations as shown are for illustrative purposes only. Thus, other example digital imaging systems in accordance with various embodiments may contain a greater or lesser number of eyes, a greater or lesser number of bridges, a greater or lesser number of alignment marks, a different pitch between eyes on a bridge, and a different spacing between multiple bridges, for example.

Figure 3:
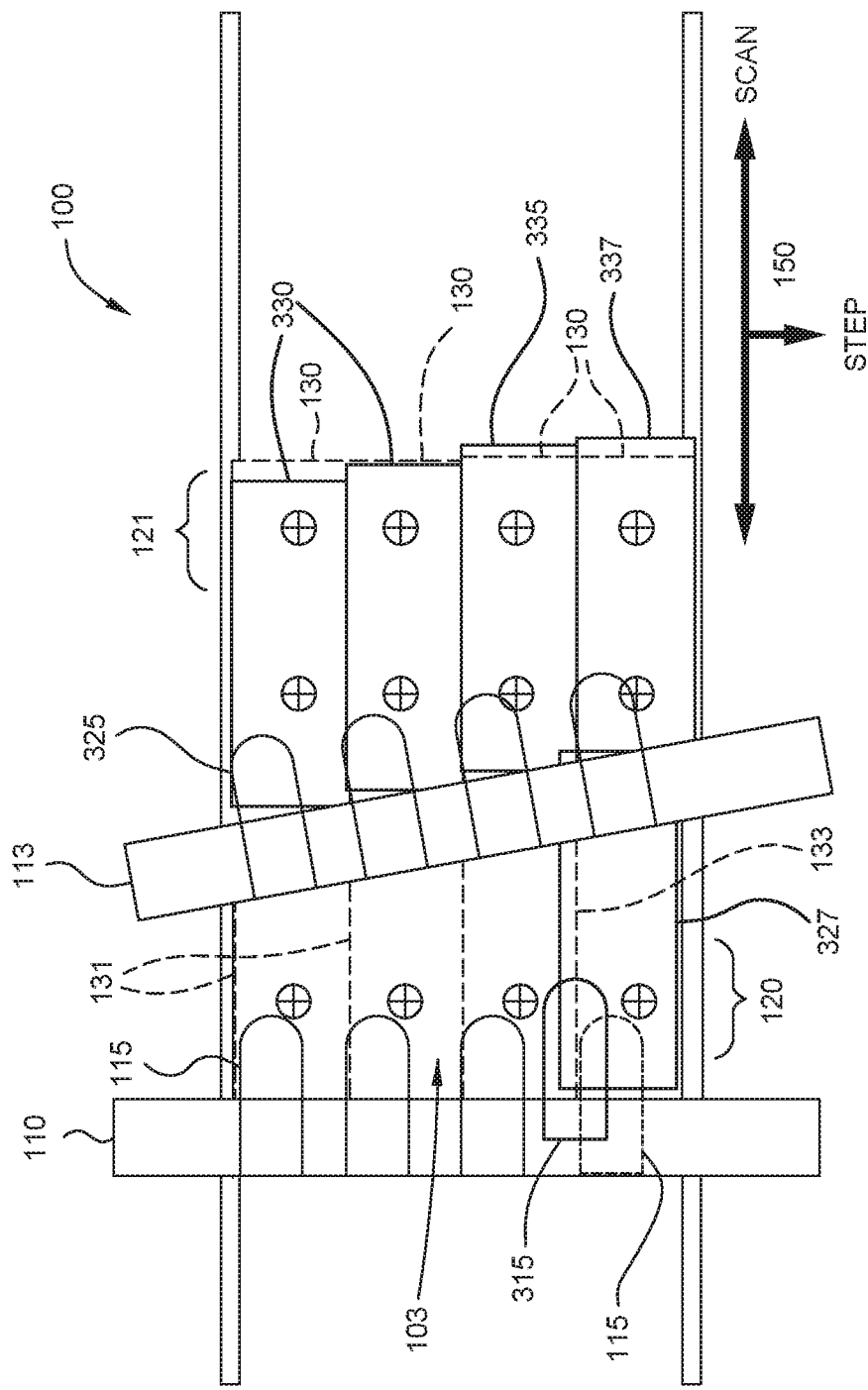
FIG. 3 depicts effects of eye drift and bridge drift on the example DLT of FIGS. 1 and 2.

FIG. 3 depicts effects of eye and bridge position drift on the example DLT 100 of FIGS. 1 and 2. In FIG. 3, example DLT 100 is the same as DLT 100 of FIG. 2, after a rotation of bridge 113, and a drift of eye 115 to position 315 has occurred. These positional changes illustrate the effects of thermal conditions and/or mechanical changes which can occur over time as a DLT is used to successively print numerous plates on a substrate. As a result of the positional changes shown in FIG. 3, while in DLT 100 of FIGS. 1 and 2 bridges 110 and 113 are parallel to each other, in the example of FIG. 3 bridge 113 has rotated in a counter clockwise direction, and is no longer parallel to bridge 110. As a result, the actual positions of all of eyes 325 of bridge 113 have changed. As noted, the bottom eye of bridge 110 has drifted upwards and to the right, from its original position 115, shown in a dashed line, to its now actual position 315, shown in a bold outline.

In DLT 100, the bridges and their respective eyes are mounted above substrate 103, whose position has not changed. However, because a print region on substrate 103 for a given eye is defined by the position of that eye, original print regions 130, shown in dashed outlines, are no longer accurate, and the actual print regions are those shown in bolded outline, as 330, 335 and 337 for eyes on bridge 113, and as 327 for the bottom eye of bridge 110. For the top three eyes of bridge 110, because their positions have not drifted, original print regions 131 and 133 have not been affected. However, because of the upward eye center drift of the bottom eye of bridge 110 to new position 315, associated print region 327 moves upwards and rightwards by the same amount, and now overlaps with the bottom portion of print region 133, as well as overlaps with the bottom left corner of print region 335 and the left side of print region 337. Moreover, there is now a gap at the bottom of print region 327.

Because the print regions defined by eyes 325 of bridge 113 are now top two print regions 330 and bottom two print regions 335 and 337, both pattern placement error as well as stitching error in eye printing boundaries has been created. Because new print regions 330 are displaced leftwards of their original positions (shown by original print regions 130), they now overlap with the top two print regions of bridge 110, namely print regions 325, which causes a stitching error. Similarly, bottom print regions 335 of bridge 113, now displaced to the right of its original positions, causes a gap to be created between its leftmost edge and the rightmost edge of printing regions 133. Although both print regions 327 and 337 have moved to the right, print region 327 has moved slightly more rightwards, and thus overlaps with print region 337 of bridge 313.

In general, in a DLT an eye may move horizontally, vertically, or rotate over time. As noted above, this is believed to be due a response to thermal and mechanical effects. In embodiments, the collective effects of eye center drift and bridge positon drift across all eyes in a DLT are corrected digitally, by creating a global alignment model, next described with reference to FIG. 4.

Figure 4:
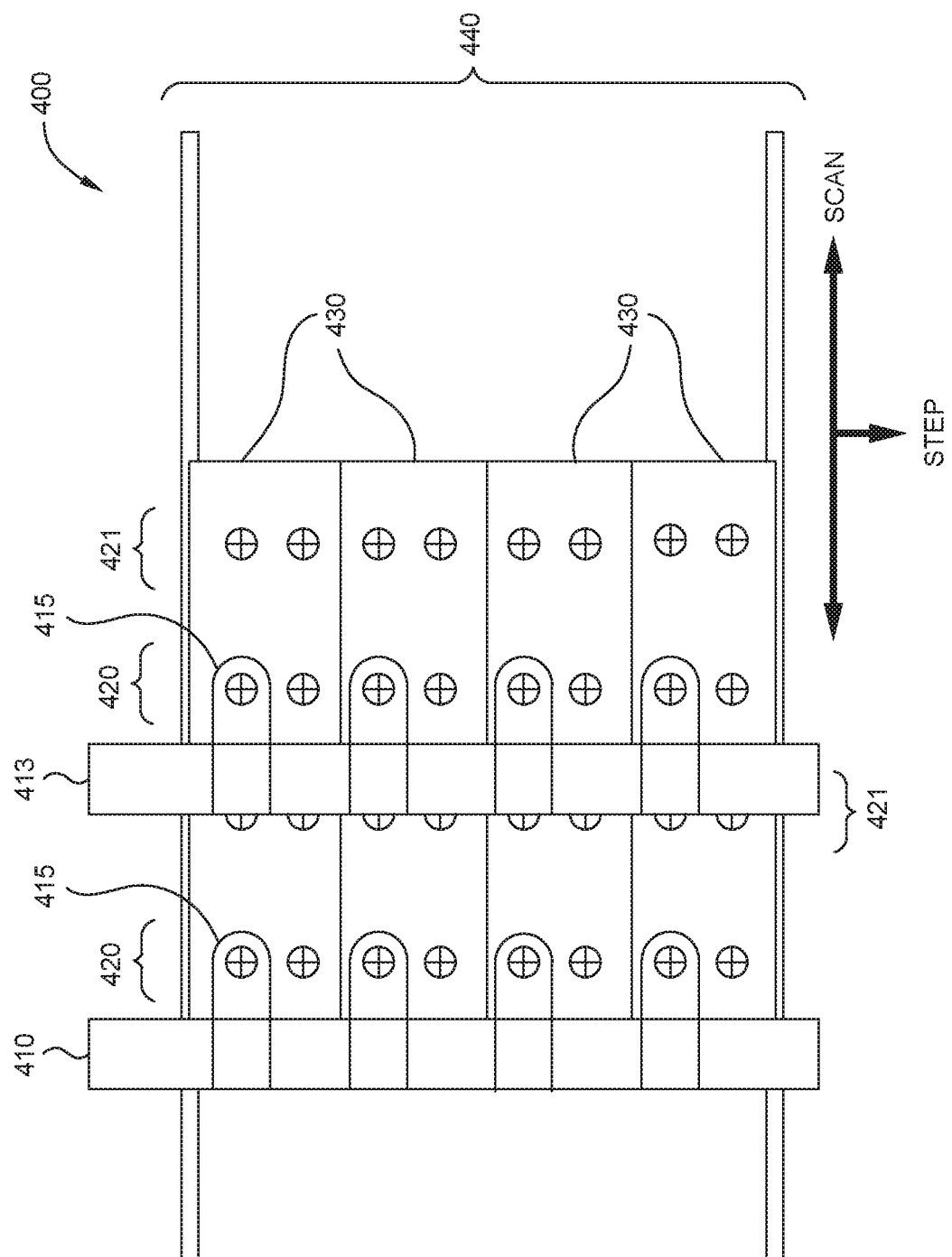
FIG. 4 depicts an example multiple imaging unit DLT in which four alignment marks per printing region are used, in accordance with embodiments disclosed herein.

FIG. 4 depicts an example multiple imaging unit DLT 400 in which four alignment marks per printing region 430 are used, two 420 at a left side of a printing region, and an additional two 421 at a right side of a printing region, in accordance with embodiments disclosed herein. The example DLT of FIG. 4 has two bridges, 410 and 413, and on each bridge four eyes 415 are provided. Thus, the example DLT of FIG. 4 is essentially identical to the example DLT of FIGS. 1 and 2, except for the use of two additional alignment marks per eye. In embodiments, the use of more than two alignment marks per eye allows for more precise capture of eye center drift and bridge position drift, as data points in two dimensions are acquired for each eye. In some embodiments, to generate a global alignment model at least two alignment marks are defined per eye.

In some embodiments, using alignment mark data from at least two alignment marks per eye, alignment modeling residuals are used to estimate the movement of each eye's center. This movement is then applied as a correction to each eye of a DLT. In one embodiment, a global linear alignment model may be generated as follows. The stage of the DLT is moved such that a set of alignment marks are under the eyes of the DLT. For example, with reference to FIG. 4, stage 440 is moved so that alignment marks 420 are below eyes 415 on each of bridges 410 and 413. Each eye is coupled to, or includes, a camera, and this camera is used to acquire an image of the alignment mark beneath the eye. In some embodiments, one or more image processing algorithms are used to obtain a position of the alignment mark within the camera's FOV, and calculate a deviation of the alignment mark from its nominal position. The stage is additionally moved, as may be needed, to place all remaining alignment marks under the eyes and acquire their respective images, such as, for example, by moving stage 440 to the left in FIG. 4 so that alignment marks 421 are captured by eyes 415 on bridges 410 and 413, respectively.

In some embodiments, a global linear alignment model may be generated that transforms the nominal alignment mark positions to the actual alignment mark positions. The global model contains shift, scale, and rotation terms in both x and y. To calculate the global alignment model, a merit function which calculates overall root mean square (RMS) error between actual mark position and model predicted position is formed. An optimization algorithm searches for global set of x and y shift, x and y scale, and x and y rotation parameters that minimizes the merit function. The model may be saved in memory and used to apply a correction prior to printing a current plate. In embodiments, this process may be performed for both pilot and production print runs.

In addition, in some embodiments, as described below in connection with FIGS. 6 and 7, historical residual data may be used to create an additional correction to the linear alignment correction described above, to compensate for more localized eye or bridge drifts, or both. It is noted that a similar method may be used to compensate for any local drift caused by any mechanism(s), if the positions of more than two alignment marks per eye printing region are acquired Any global linear plate to plate variation may be captured and compensated for by a global linear alignment model, as described above.

In some embodiments, an overlay correction feedback may be applied based on a pointwise average of pilot runs to compensate process related positional errors or to compensate for the difference between alignment and overlay. In embodiments, this correction feedback may be performed based on overlay measurement on a metrology tool after a lithography printing and development process has completed.

In one embodiment, by using four alignment marks per eye, as shown for example in FIG. 4, a history based linear predictive model per eye can be created. The model can predict additional scale, rotation, and orthogonality corrections to be applied for each eye.

Next described are some advantages of digital positional corrections, in accordance with embodiments disclosed herein, over conventional positional correction approaches. It is initially noted that in mask based conventional lithography, overlay is done by mechanically aligning a wafer (or a glass plate) and mask alignment marks. This requires mechanically moving imaging units, and involves static corrections. In contrast, digital corrections in maskless lithography systems do not require any mechanical alignment. Imaging units are not moved, and dynamic corrections can be applied per scan based on predicted variations. Moreover, digital positional correction can apply higher order corrections, as it does not depend on imaging unit configuration.

Figure 5:
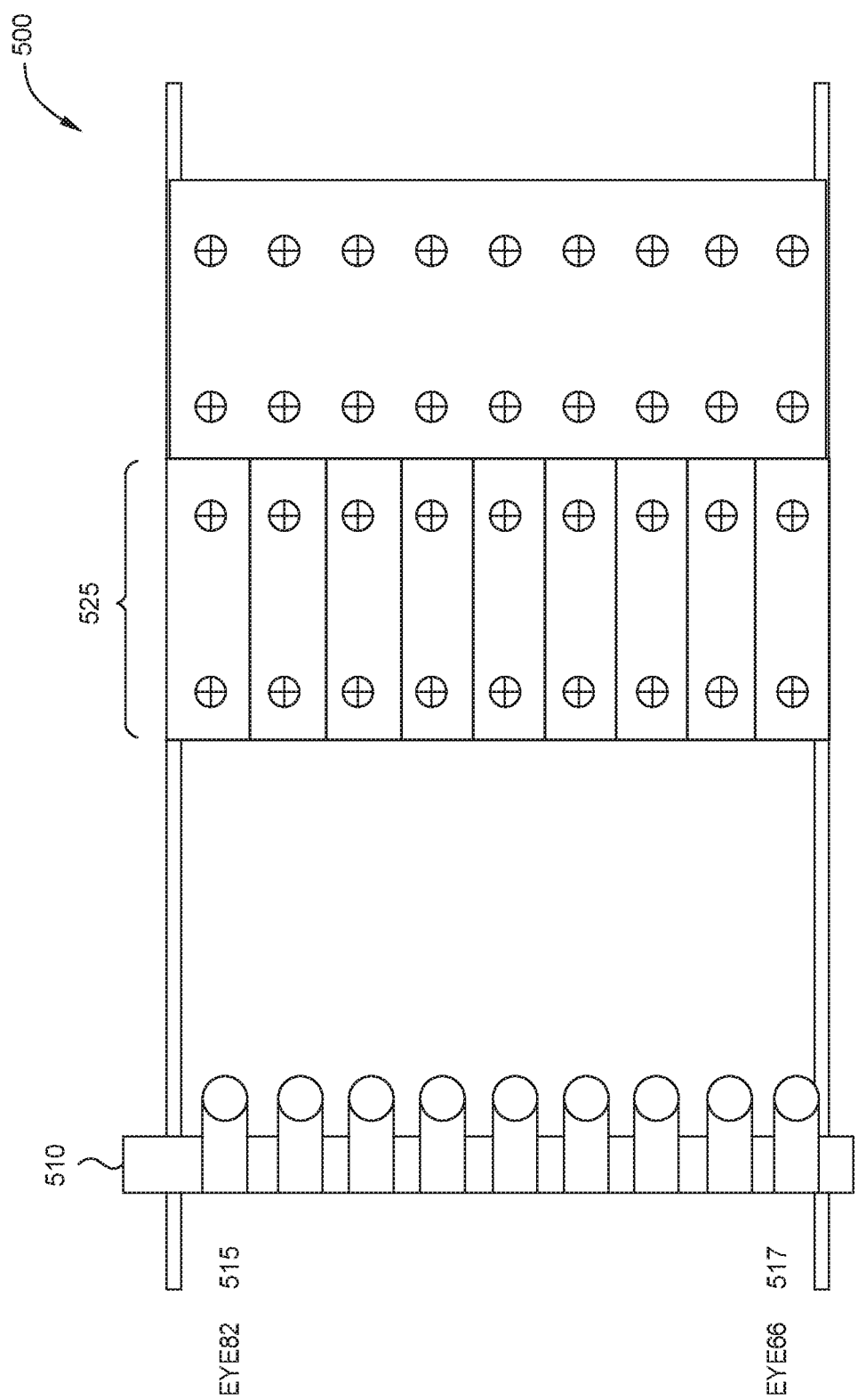
FIG. 5 depicts an example DLT with nine (9) eyes, in accordance with embodiments disclosed herein.

FIG. 5 illustrates an example nine eye DLT 500, with two alignment marks defined per eye. This example system includes bridge 510. Two eyes at the ends of each bridge are labeled, being Eye66 515 and Eye82 517. They are so labeled to track the example results presented in the eye center variation plots of FIG. 7, described below, and reflect a numbering scheme where eyes are labeled from the bottom up using even numbers. Thus beginning from Eye66, in this example DLT the intermediate eyes are designated as Eye68, Eye70, Eye72, Eye74, Eye76, Eye78 and Eye80. Each eye defines a printing region, shown for example at 525, and within each printing region two alignment marks are provided on a substrate. In the manner described above for the example systems of FIGS. 1 and 4, data may be collected from operation of the example DLT of FIG. 5, and a global linear alignment model calculated. Additionally, for this same example system, as next described with reference to FIG. 6, a machine learning model may be generated, which takes as inputs historical data (from prior printed plates) for a given eye within a forecasting window and outputs a forecast of eye center variation for a currently printing plate. This is next described.

In embodiments, different types of machine learning (ML) based models may be used. For example, classical statistical forecasting models may be used on a per eye basis to forecast eye center movement, or, for example, on a per alignment mark basis, to forecast local corrections. Or, for example, statistical machine learning models: Considers interaction between each sensor (in our case, mark position) in addition to each individual sensor to forecast local corrections needed. Model is trained using a large set of data where input of the model is a partial data set within the forecasting window.

Figure 6:
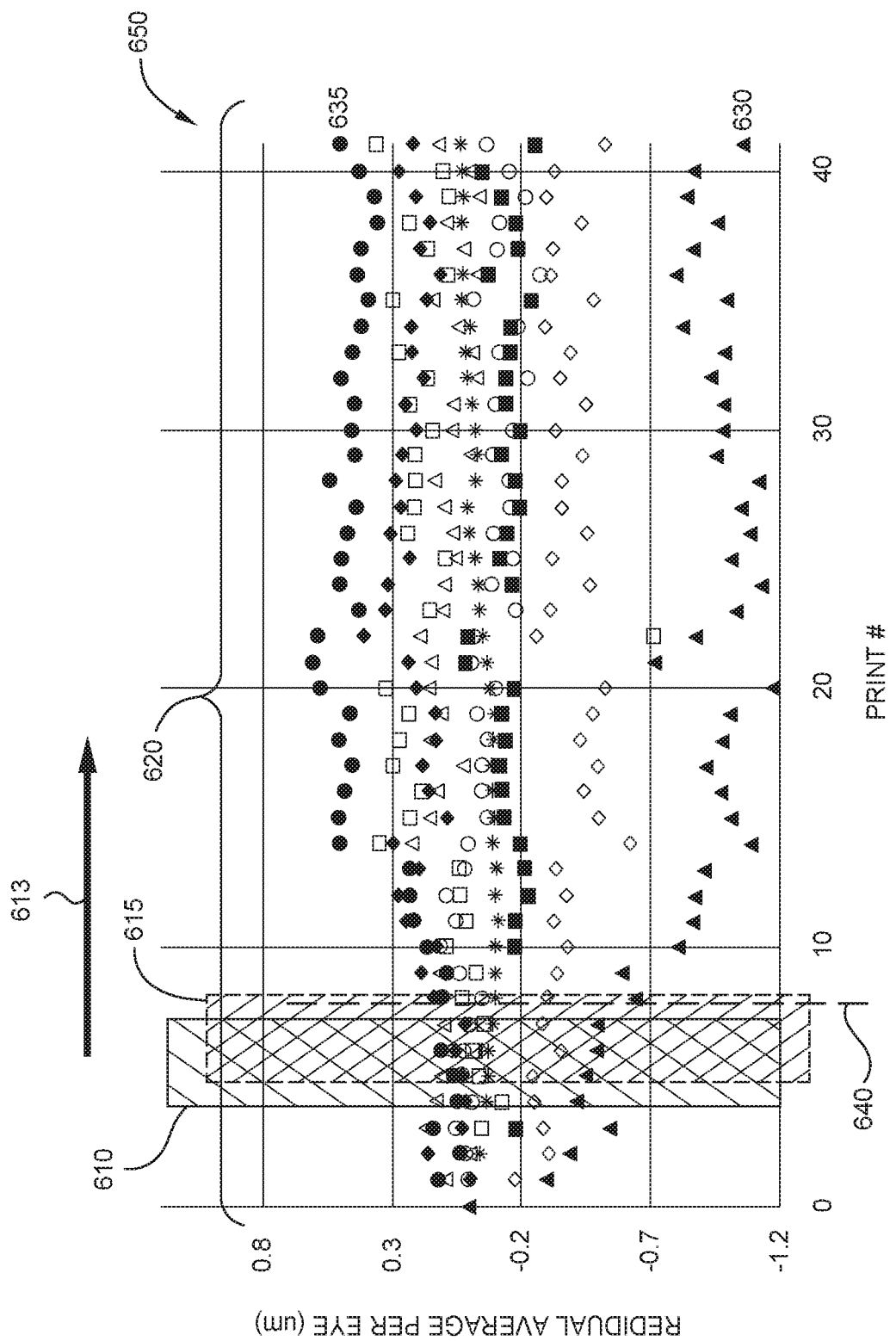
FIG. 6 depicts a set of example model training data and an example sliding forecasting window used to forecast eye center variation for an eye of a multiple imaging unit DLT based on historical data, in accordance with embodiments disclosed herein.

FIG. 6 depicts a set of example historical model training data 620 and an example sliding forecasting window 610, 640 used to train a model to forecast eye center variation for a set of eyes of a multiple imaging-unit DLT, in accordance with embodiments disclosed herein. The example data shown in FIG. 6 was acquired from a nine eye DLT, similar to the example DLT shown in FIG. 5. Thus, a separate plot for each of the nine eyes is shown in FIG. 6, where each eye's plot uses a different symbol. The eyes at the two ends of the bridge, analogous to Eye66 and Eye82 of FIG. 5, showed the largest average residual variance in this training data set, and are labelled as eyes 630 and 635, respectively, in FIG. 6.

In one embodiment, a predictive model to forecast eye center drift may be generated and trained as next described. Initially, alignment model residual data 620 may be collected for all eyes in the DLT, as well as overlay error data. As noted above, and as described below in connection with block 1025 of FIG. 10A, overlay error data includes a required correction vector for each plate. As further noted above, the model residual data is the difference between a global alignment prediction for an eye obtained from a global alignment model, and the actual position of the eye. This difference is known as "residual data" for that eye, for a given print or plate.

Continuing with reference to FIG. 6, a forecasting window is defined for an example predictive model. The forecasting window determines how many previously printed plates N to use in the forecast of eye center variation for a current plate—and thus a forecast of the required correction to apply. For example, for N=5, the most recent five plates are used. In some embodiments, the forecasting window is an integer between 3 and 5. In other embodiments, where longer term effects are of greater influence, N may be greater.

For an example value of N=5, all model residual data within the forecasting window is used as a "feature vector" $X_i$, where i=N−5,N−4,N−3, N−2 and N−1. The required correction for the Nth plate (e.g., the current plate 640 in FIG. 6) is defined as $Y_i$, and a model function g that maps $X_i$ to the $Y_i$ vector is determined. Thus, in one or more embodiments, a separate g for each eye is calculated. In alternate embodiments however, an average or common function g may be used for all eyes as a whole.

In one or more embodiments, by sliding forecasting window 640 one step at a time through all of the data, as indicated by arrow 613, multiple $X_i$ and $Y_i$ data sets are obtained. In cases such as the first few plates of a DLT printing process, where there is not yet a full N runs of historical data, the available data is used. For example, for the first plate the current plate data is used, and for the second plate, the first plate data and the current plate data are used, etc.

In one or more embodiments, once model parameters (e.g., the parameters of function g) are trained, the model is stored in a DLT and used to forecast a correction to apply for any eye to the currently printing plate, based on that eye's residual center drift for the N prior prints. In embodiments, the model may be trained offline, and the training data need not be stored in the DLT. In some embodiments, alignment data of pilot print runs are stored on a DLT main server in a text file, and also stored in memory for easy access. In embodiments, for production printing, only a limited number of historical alignment data, as defined by the size of the forecasting window, may be stored. As noted, in some embodiments, this is from three to five historical alignment data files. In some embodiments, these historical data files may be stored on a DLT main server, and also kept in the memory for easy access. In one embodiment, a first-in-first-out (FIFO) approach is used to store the files on the server, and in memory, so as to minimize the amount of data necessary to be stored.

In one or more embodiments, various combinations of data for a predictive model may be implemented. For example, in one statistical forecasting embodiment, the average per eye using all plates within the forecasting window may be used, each plate having an equal contribution. Or, for example, in a first alternate embodiment, instead of an equally weighted average, a weighted average may be calculated, where, for example, a weight applied to the eye position residual in more recent plates is weighted more heavily than that applied to the residual for plates farther back in time. Thus, for example, data from plate N−1 has a greater weight than plate N−2, etc. In one example, an exponential weighting may be used. In each of these two embodiments (statistical forecasting and weighted statistical forecasting) the overlay data is not used.

In a second alternate embodiment, a weighting function using ML models is determined using previous runs where alignment data was recorded, and where overlay was measured for all plates. In such embodiments, each DLT and/or fabrication facility may have a different ML model. In such embodiments, the model may be improved over time as more and more alignment and overlay data is obtained, overlay data is sued to train the model, and may also be continually collected to improve the model.

In embodiments, a global linear model and an ML model such as described in connection with FIG. 6 are combined and applied as a correction to each print. Because the corrections are applied digitally (e.g., the eyes and bridges of the DLT are not moved, the two corrections may be mathematically combined in a combined correction. In such embodiments, the ML model is based on the residual of global linear alignment model, and it thus covers remaining local variations from the global linear model. For example, in such embodiments, a global linear model may be generated. Then the residuals of the model fitting for each mark may be calculated, where, as noted above, a residual is the difference between model prediction and real measured position of an alignment mark. In such embodiments, by using the residual data within the forecast window, an additional linear model may be created per eye, and the per eye ML model scale correction may be added to the global alignment scale correction to determine an overall scale correction for that eye. In such embodiments, the same correction may be done for shift and rotation. (As noted above, the global alignment model is optimized to minimize overall RMS error by finding a global set of x and y shift, x and y scale, and x and y rotation parameters that minimizes the merit function).

Figure 7:
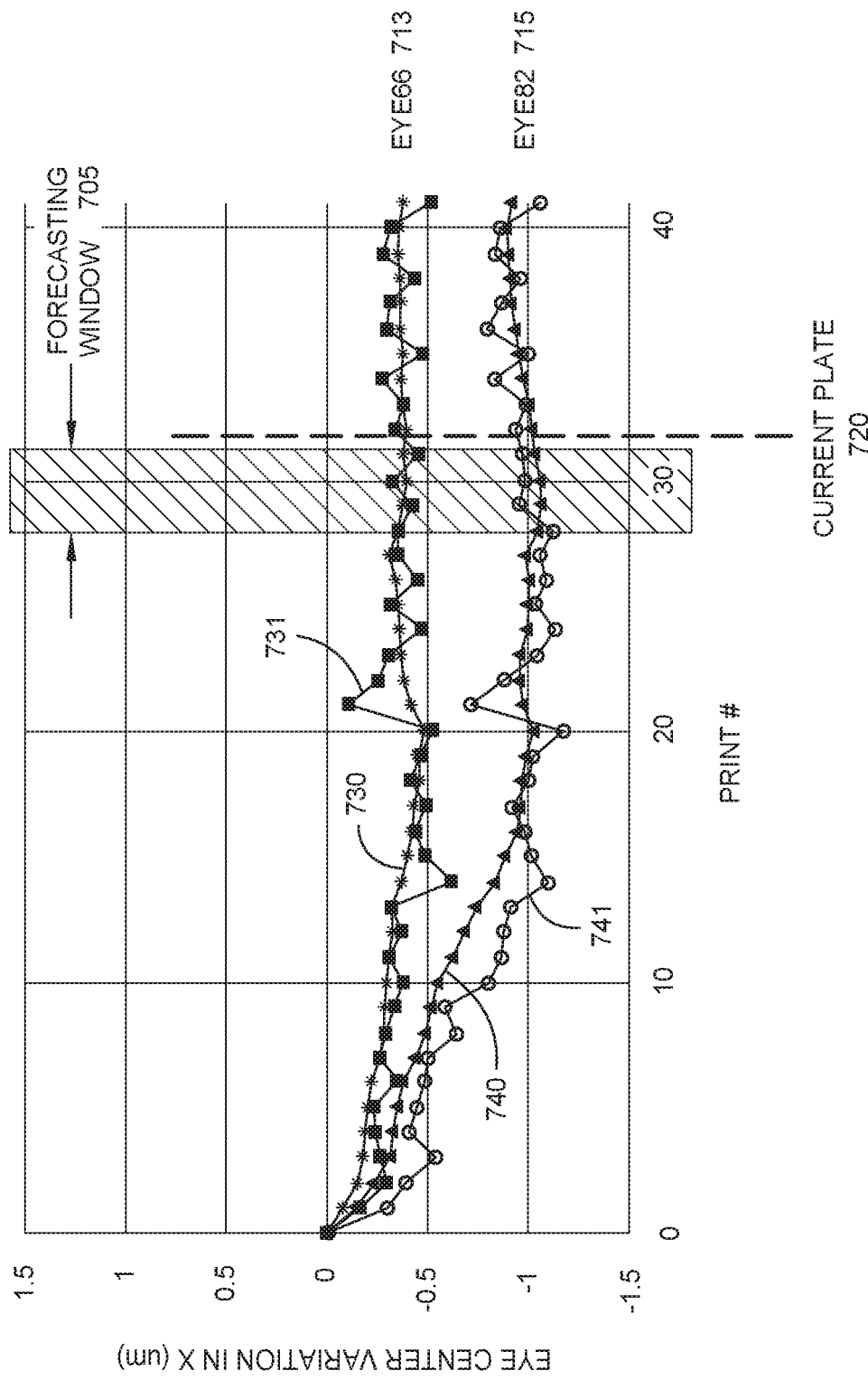
FIG. 7 depicts a plot of actual and forecasted eye center variation for the two example eyes labelled in FIG. 5, in accordance with embodiments disclosed herein.

FIG. 7 is a plot comparing forecasted and real data for the two example eyes identified in FIGS. 5 and 6, Eyes 66 and 82. The forecasts for each of these eyes were generated using a model that was previously trained as described above in connection with FIG. 6, and, like the training data shown in FIG. 6, they present data for 42 actual print runs. The $0^{th}$ print run for each eye represents an initial pilot run, and therefore all four plots 730, 731, 740 and 741 have a zero value at that print run, it being the benchmark against which subsequent eye center variation is measured. In one embodiment, the model is stored in a DLT and is used to generate forecasts for a currently printing plate 720, based on actual eye center variation input data for a pre-defined number of immediately prior scans. In one embodiment, the forecasted eye center variation is used to digitally correct a pattern being printed by that eye.

In the example of FIG. 7, a forecasting window 705 of length N=4 was used, and thus the input to the model, for each of the two eyes shown, is the actual eye center variation for print runs N−1, N−2, N−3 and N−4, where N is the currently printing plate. As shown, for Eye66 713 the plot of the forecasted eye center variation 730 is slightly less than the real eye center variation 731 for print numbers 1-15, nearly matches the real eye center variation for print runs 16-20, and then is an approximate average value for print runs 21-42. Similar results are seen for Eye82 715 in forecast plot 740 and real eye center variation plot 741, except that in the case of Eye82 715, the portion of the forecast plot 740 that is an approximate average value of the real plot 741 begins at print number 20.

In the example of FIG. 7, a simple equally weighted moving average model was used. In other embodiments other forms of moving average models, such as, for example, weighted average or the like may be applied. With reference to plots 730 and 731, and 740 and 741 of FIG. 7, because a simple moving average was used as the forecasting model, the following behavior of the forecast plots is observed. Initially, the forecasted eye center variance 730, 740 lags the real eye center variance 731, 741 because the real variance is increasing. There is an inflection point at Print No. 20, where the eye center variation stops increasing and begins decreasing, and then, on average, levels off. Because the forecast model is a moving average, it smooths out changes between two consecutive prints, as shown.

Figure 8:
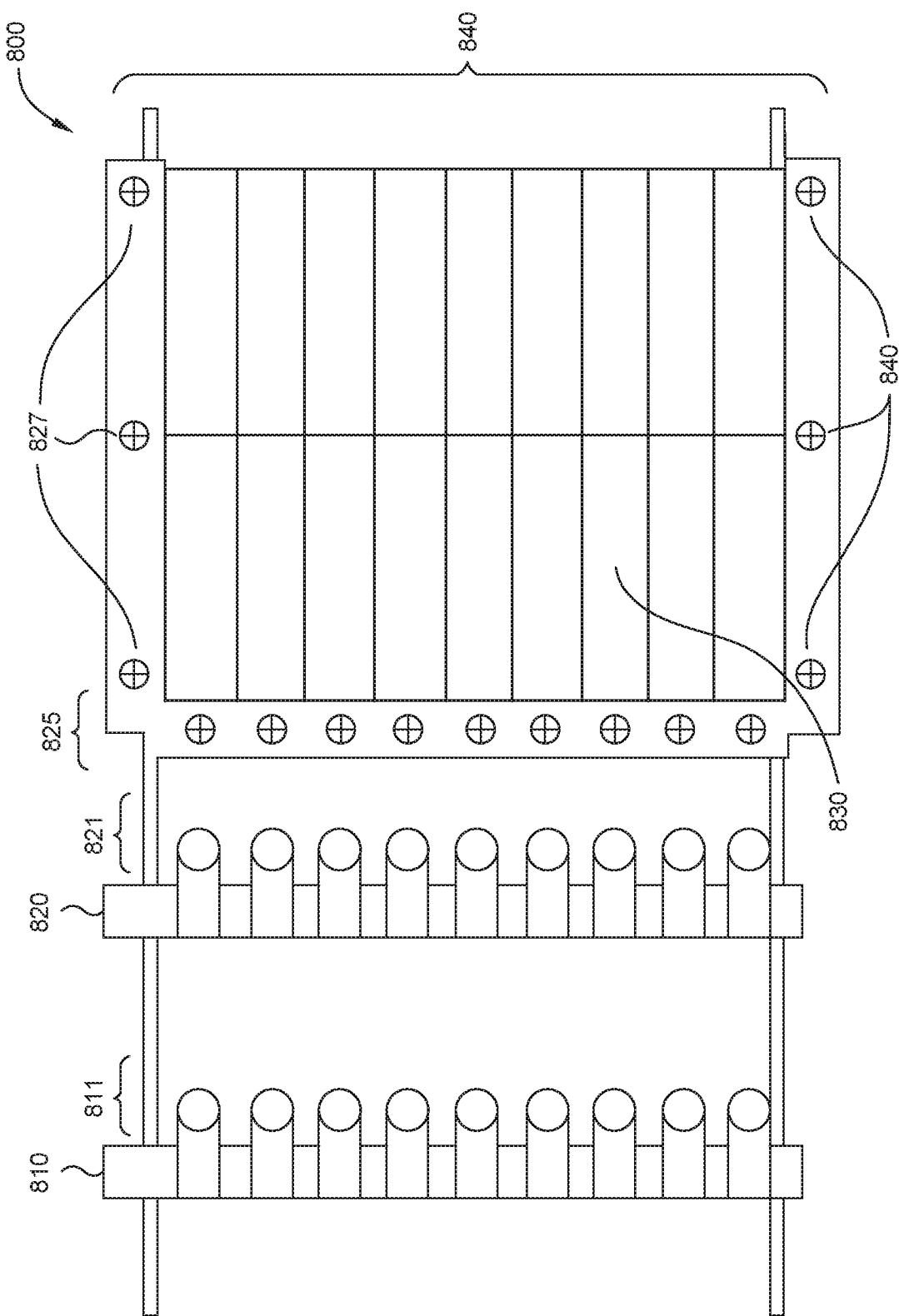
FIG. 8 depicts placement of alignment marks for an example machine learning based correction for first layer printing, in accordance with embodiments disclosed herein.

Next described, with reference to FIG. 8, is a method of learning based correction for first layer printing, in accordance with one embodiment. The method of FIG. 8 addresses the problem of a first printing layer, in which there are no alignment marks provided on the substrate. Because of this, in embodiments, permanent alignment marks may be placed on fixed portions of the DLT, such as the stage, or a chuck coupled to the stage. The eyes are placed above these "non-substrate" alignment marks, their images are acquired by cameras coupled to the eyes, and a forecast model for eye drift is created.

FIG. 8 shows an example DLT 800 with bridges 810 and 820. DLT 800 is an eighteen eye system with nine eyes on each of two bridges. Thus, bridges 810 and 820 are respectively provided with eyes 811 and 821. Substrate 830 shows a printing region for each eye, eighteen printing regions in total. Because this is a first layer printing, there are no alignment marks on the glass plate of substrate 830. In order to track eye center variation, alignment marks are provided on a chuck or attached to stage 840. These are illustrated in a line of alignment marks 827 at the top of substrate 830, a second line of alignment marks 829 on the bottom of substrate 830, and a line of alignment marks 825 adjacent to substrate 830 on its left edge.

In one embodiment, to forecast eye center variation, which may include, for example, to capture bridge to bridge variation and/or to capture inter-bridge variation between eyes (for example, similar to that depicted in FIG. 3, described above), stage 840 is moved a number of times so as to, overall, place the permanent alignment marks under each eye 811, 821. As a first step, stage 840 is moved to capture alignment marks 825 by eyes 821. As a second step, stage 840 is moved to capture alignment marks 825 by eyes 811. In this way, each eye captures an image of at least one alignment mark, and image processing may be used to obtain a position of the alignment mark within the camera FOV, and to determine therefrom a first measured position of the alignment marks by each eye before a first layer pilot printing is performed. In one embodiment, the pilot print is performed without any correction. In one embodiment, the set of first alignment mark positions of all of the eyes may be designated as reference mark positions. In one or more embodiments such a first pilot run printing may be measured in a total pitch metrology tool, if a total pitch specification needs to be satisfied. In such embodiments, based on such a measurement, a digital total pitch correction may be applied. It is noted that "total pitch" may sometimes refer to a measure of distortion adopted in a given display manufacturing industry.

In one or more embodiments, before each first layer printing, the entire mark position finding process may be repeated as in the pilot run described above. In such embodiments, the alignment mark positions measured in the pilot run may be respectively subtracted from the current alignment mark positions for each eye, to calculate the drift relative to the pilot run on the alignment mark positions. In such embodiments, these relative drifts may be used to estimate the movement of each eye's center. This movement may then be respectively applied as a correction to each eye of DLT 800 for that printing. If a total pitch correction (e.g., a global alignment prediction) is determined from the pilot run, that correction may also be applied. In this way all of the plates print the same way even though there is drift on eye centers.

Additionally, in one or more embodiments, a forecast model may be created using historical drift data and then stored in a DLT. The forecast model may be used to apply a correction to a currently printing first layer. In one embodiment, classical statistical forecasting models may be used on a per eye basis to forecast eye center movement for each plate during production. In one or more embodiments, the forecasting model may average or weighted average drifts within a forecasting window to be applied to a current plate. Alternatively, in other embodiments, a machine learning model may be used to define a weighing scheme, where the model is trained using historical data of alignment drift and corresponding total pitch measurements.

In one or more embodiments, the frequency of mark measurement may be determined based on drift transition behavior. This may be implemented, in one or more embodiments, to improve the tact time in production. Thus, for example, if drift changes quickly, a more frequent mark measurement is required. Similarly, in such embodiments, if drift is slow, then instead of measuring mark positions before each plate printing, the measurement may be performed for every Nth plate, where N is an integer. In such embodiments, a calculated correction may be applied until the next set of mark measurements. Thus, in such embodiments, previously calculated corrections are applied for all the plates for which there is no mark position measurement. For example, plates N+1, N+2, . . . , 2N−1 each use the corrections from plate N.

Figure 9:
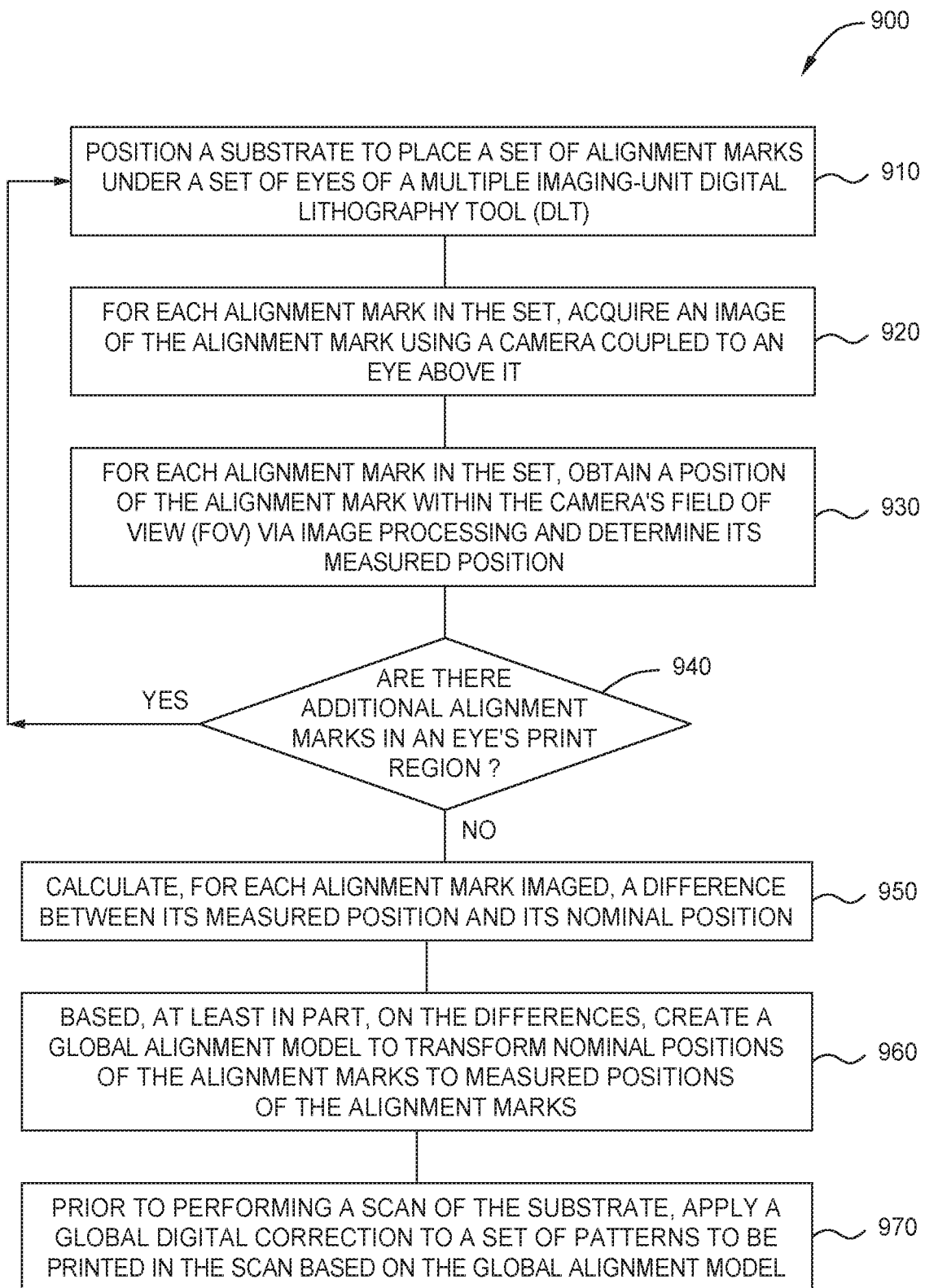
FIG. 9 depicts an embodiment of a method of generating a global alignment model, in accordance with embodiments disclosed herein.

FIG. 9 depicts an embodiment of a method 900 of generating a global linear alignment model, in accordance with embodiments disclosed herein. The depicted embodiment of the method includes blocks 910 through 970. In other embodiments, method 900 method may have more, or fewer, blocks.

At block 910, a substrate is positioned by a stage of a DLT to place a set of alignment marks provided on the substrate under a set of eyes of a multiple imaging-unit DLT. In embodiments, the substrate is positioned by moving a stage to which the substrate is attached. An example of this is shown in FIG. 1, where stage 140 has been moved so that alignment marks 120 are placed beneath eyes 115 for each of bridges 110 and 113. At block 920, for each alignment mark in the set, an image of the alignment mark is acquired with a camera of the eye of the DLT that is above the alignment mark. For example, the camera may be integrated into the eye, or, for example, it may be coupled to it. At block 930, for each alignment mark in the set a position of the alignment mark within the camera's field of view (FOV) is obtained. In embodiments, the position is obtained via image processing, such as correlation or edge detection, or a hybrid method that combines both performed by a processor or controller of the DLT, to determine a measured position of the alignment mark. In embodiments, the measured position of the alignment mark is in terms of a co-ordinate system of the stage, or one readily transformable into stage co-ordinates, such as, for example, a substrate co-ordinate system.

At query block 940 it is determined if there are additional alignment marks in the print region of each eye of the set of eyes. This may be performed, for example, by a processor or controller of the DLT that tracks the number of alignment marks provided on the substrate being printed on, as well as the number of, and which, alignment marks have been already imaged. In some embodiments, query block 940 will return a "Yes" because, as described above, it is preferred to have at least two alignment marks defined for each eye. For example, as shown in FIG. 1, each print region 130 has two alignment marks 120 and 121, or, for example, as shown in FIG. 4, each print region 430 has four alignment marks, or, for example, as shown in FIG. 5, each print region 525 has two alignment marks. If query block 940 returns a "Yes", then the method moves to block 910, and blocks 910 through 930 are repeated for another set of alignment marks, and this process continues until images of all of the alignment marks on the substrate have been acquired and their measured positions determined.

When query block 940 returns a "No", then at block 950, for each alignment mark imaged, a difference between its measured position and its nominal position is calculated. For example, if the nominal position and the measured position are both expressed in 2D co-ordinates of the stage, then a calculation using a distance function may be used by a processor of the DLT to determine the difference. At block 960, based at least in part on the differences for all of the imaged alignment marks, a global alignment model is created to transform the nominal positions of the alignment marks to their measured positions. For example, the global alignment model may be created by a processor of the DLT running a machine learning and forecasting module or program, such as machine learning, modelling and forecasting module 112 of FIG. 11. At block 970, prior to performing a scan of the substrate, a global digital correction to a set of patterns to be printed in the scan is applied based on the global alignment model.

In some embodiments, as described above, the global alignment model contains shift, scale, and rotation terms in both x and y, where x and y are dimensions of a substrate of the DLT. In such embodiments, to calculate the global alignment model, a merit function which calculates overall root mean square (RMS) error between actual mark position and model predicted position may be formed, and an optimization algorithm that searches for global set of x and y shift, x and y scale, and x and y rotation parameters that minimizes the merit function may be applied. In such embodiments, the global alignment model may be saved in memory and used to apply a correction prior to printing a current plate. In such embodiments, this process may be performed for both pilot and production print runs.

Figure 10A:
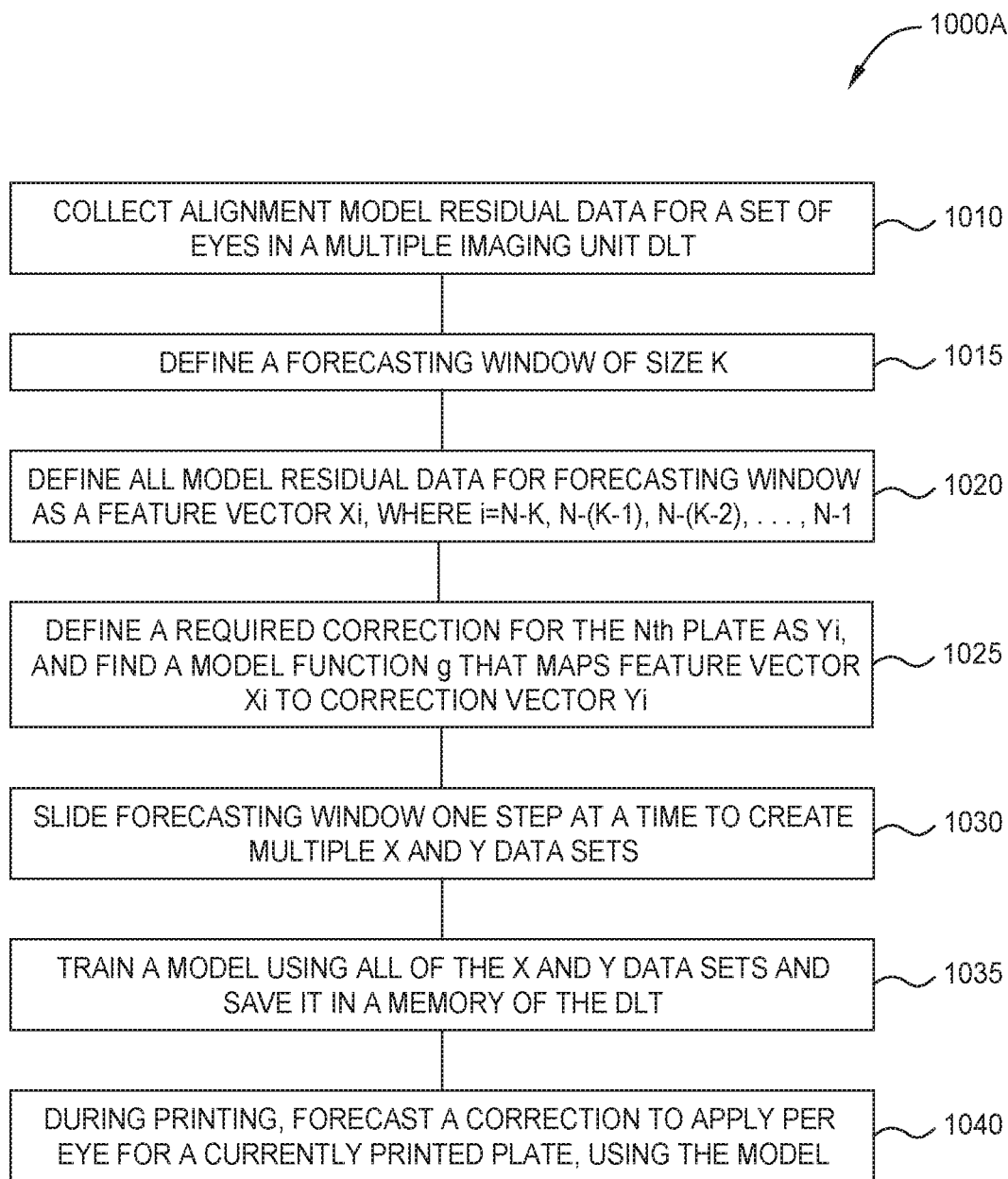
FIG. 10A depicts an embodiment of a method of collecting global alignment model residual data and training a model to forecast a correction for an eye printing region of a currently printing plate in accordance with embodiments disclosed herein.

FIG. 10A depicts an embodiment of a method 1000A of collecting global alignment model residual data and using it to train a forecasting model to forecast a correction for an eye printing region of a current plate, in accordance with embodiments disclosed herein. The depicted embodiment of the method includes blocks 1010 through 1040. In other embodiments, method 1000A method may have more, or fewer, blocks.

At block 1010, alignment model residual data for a set of eyes in a multiple imaging-unit DLT is collected. For example, data 620 for the nine eye DLT of FIG. 6. At block 1015, a forecasting window of size K is defined, where K is an integer. In some embodiments, K is between 3 and 5. In other embodiments, it is larger than 5. At block 1020, all model residual data within the K prints of the forecasting window is defined as a feature vector $X_i$, where i is a sequence of integers from 1 through K. For example, for a given eye, for a forecasting window of size K=5, the feature vector at currently printing plate N includes residual data for that eye for plates (N−5), (N−4), (N−3), (N−2) and (N−1)

(e.g., data from the approximately horizontal plot for that eye within the forecasting window).

At block 1025, the required correction for the Nth plate is defined as a vector Yi, and a model function g is found that maps feature vector Xi to correction vector Yi. In embodiments, correction vector Yi may include two dimensions, to express the horizontal and vertical distances between the nominal position of the eye and the actual position. At block 1030, the forecasting window is stepped forward through the training data one plate at a time to create multiple X (input) and Y (output) data sets, and at block 1035 a model is trained on all of the X and Y data sets so created, so that each X feature vector is mapped to the corresponding Y correction vector. The model is then saved in a memory of the DLT.

As noted above with reference to FIG. 6, in one embodiment, operations at blocks 1010 through 1035 may be performed offline, by a processor of a machine learning model and training device, and need not be performed by a DLT that uses the model, once trained. If the operations of blocks 1010 through 1035 are performed offline, then at block 1035 the model may be stored in a memory of the DLT, so that it can be used. In other embodiments, the model may be stored in network storage accessible to network attached devices.

At block 1040, during printing of a current plate by the DLT, a correction to apply per eye is forecast, using the model.

Figure 10B:
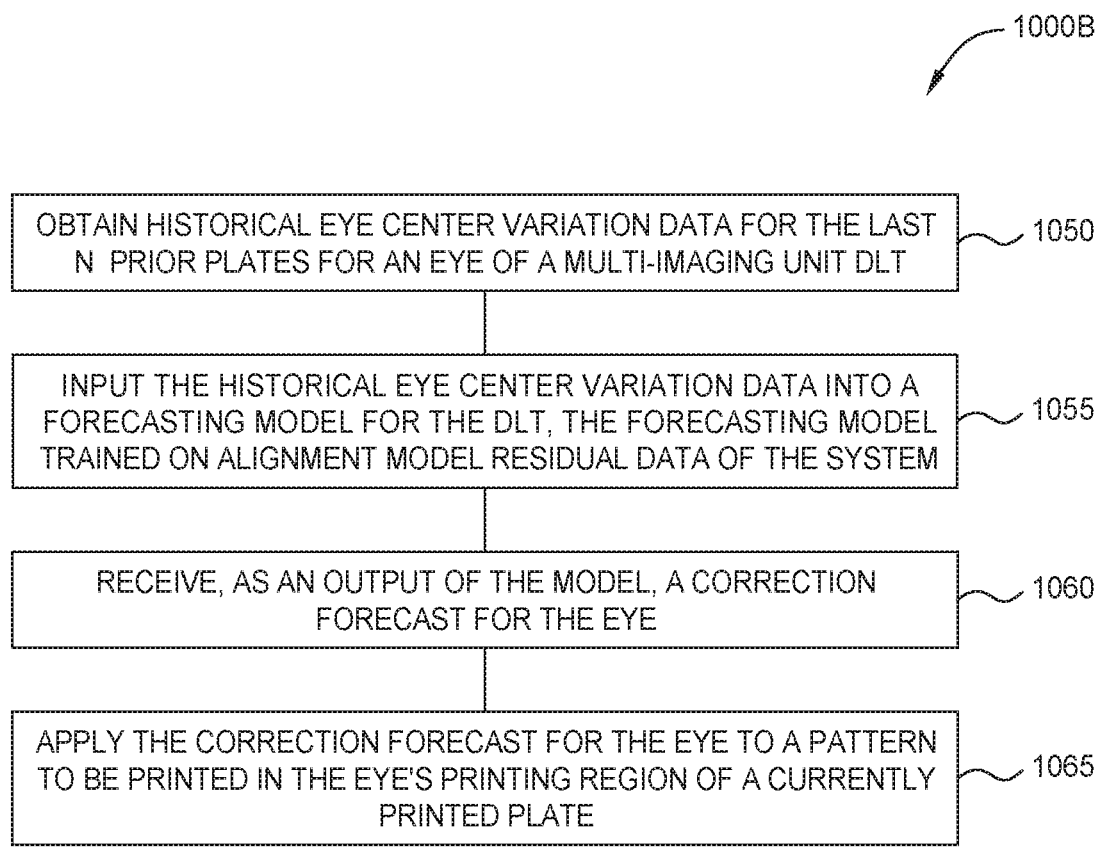
FIG. 10B depicts an embodiment of a method of inputting historical residual alignment data from the last K plates printed by a DLT, obtaining a correction forecast for an eye of the DLT, and applying the correction forecast when printing a current plate in accordance with embodiments disclosed herein.

FIG. 10B depicts an embodiment of a method 1000B of inputting historical residual alignment data from the last K plates printed by a DLT, obtaining a correction forecast for an eye of the digital lithography system, and applying the correction forecast to the eye when printing a current plate, in accordance with embodiments disclosed herein. The depicted embodiment of the method includes blocks 1050 through 1065. In other embodiments, method 1000B method may have more, or fewer, blocks.

At block 1050, historical eye center variation data for the last N prior plates for an eye of a multiple imaging-unit DLT is obtained. For example, if a DLT is printing a $20^{th}$ plate, this data includes eye center variation data for the $19^{th}$ through $15^{th}$ plates, previously printed. In one embodiment, this data is stored in a buffer of a memory of the DLT, such as FIFO buffer 1109 of FIG. 11, and is loaded from the buffer to a forecasting module of a processor of the DLT, such as, for example, machine learning, modelling and forecasting module 1112 of FIG. 11.

At block 1055 the obtained historical eye center variation data is input into a forecasting model, the forecasting model having been trained on alignment model residual data for the DLT, such as, for example data 620 of FIG. 6. The forecasting model, for example, is a model saved in a memory of the DLT at block 1035 of method 1000A of FIG. 10A, described above. In one embodiment, the model is saved in a forecasting module of a processor of the DLT, such as, for example, machine learning, modelling and forecasting module 1112 of FIG. 11. In other embodiments the model is stored in network storage accessible to network attached devices, including the DLT.

At block 1060 a correction forecast for the eye, to be applied when printing the current plate, is received as an output of the forecasting model, and at block 1065 the received correction is digitally applied to a pattern to be printed in the system's printing region of the currently printed plate.

Figure 11:
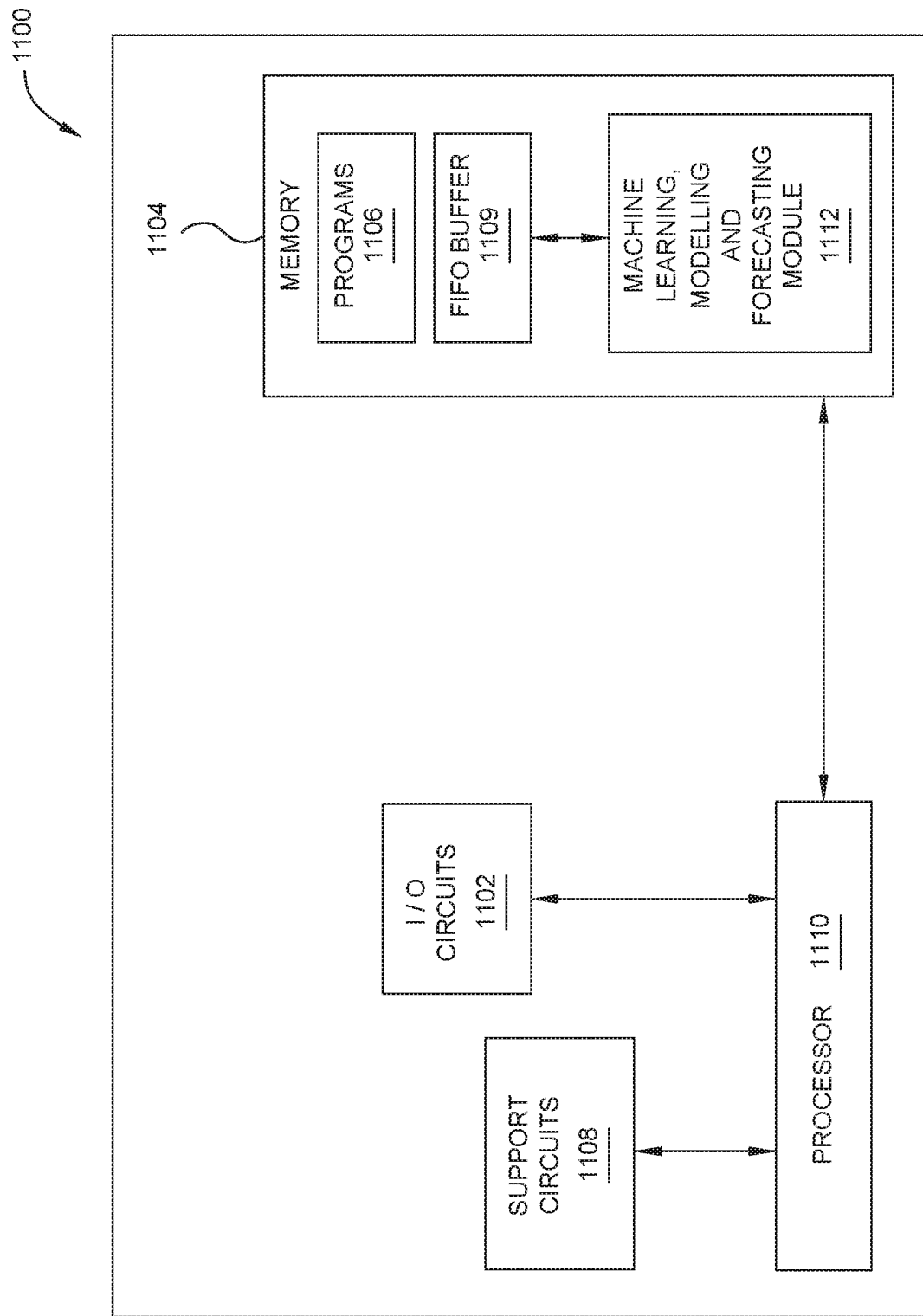
FIG. 11 depicts an embodiment of a high-level block diagram of a machine learning and forecasting system for creating and applying models for correcting for eye center movement in multi-imaging unit DLTs in accordance with embodiments disclosed herein.

FIG. 11 depicts an embodiment of a high-level block diagram of a machine learning and forecasting system 1100 for creating and applying models to correct for eye center movement in multiple imaging-unit digital lithography tools (DLTs), in accordance with embodiments disclosed herein. For example, the machine learning and forecasting system 1100 is suitable for use in performing the methods of FIGS. 9, 10A and 10B. The machine learning and forecasting system 1100 includes a processor 1110 as well as a memory 1104 for storing control programs and the like.

In various embodiments, memory 1104 also includes programs that create machine learning based models for correcting alignment in multiple imaging-unit DLTs, for forecasting eye center movement for an individual eye of a DLT, and for applying such a forecasted correction for the eye to a pattern to be printed in the eye's printing region of a currently printed plate. In some embodiments, the memory 504 includes programs (not shown) for controlling movement of a stage, such as, for example, stage 140, as shown in FIGS. 1 and 2, or stage 440 as shown in FIG. 4, as part of applying the forecasted correction for an eye.

Processor 1110 cooperates with conventional support circuitry 1108 such as power supplies, clock circuits, cache memory and the like as well as circuits that assist in executing the software routines 1106 stored in memory 1104. As such, it is contemplated that some of the process steps discussed herein as software processes can be loaded from a storage device (e.g., an optical drive, floppy drive, disk drive, etc.) and implemented within the memory 1104 and operated by the processor 1110. Thus, various steps and methods of the present disclosure can be stored on a computer readable medium. The machine learning and forecasting system 1100 also contains input-output circuitry 1102 that forms an interface between various functional elements communicating with the machine learning and forecasting system.

Although FIG. 11 depicts a machine learning, modelling and forecasting system 1100 that is programmed to perform various control functions in accordance with the present disclosure, the term computer is not limited to just those integrated circuits referred to in the art as computers, but broadly refers to computers, processors, microcontrollers, microcomputers, programmable logic controllers, application specific integrated circuits, and other programmable circuits, and these terms are used interchangeably herein. In addition, although one machine learning and forecasting system 1100 is depicted, that depiction is for brevity only. It is appreciated that each of the methods described herein can be utilized in separate systems or in the same system by software changes.

Although aspects have been described herein as utilizing methods and systems for increasing accuracy in layer alignment by reducing measurement error(s) in the actual location of an alignment mark(s), these descriptions are not intended in any way to limit the scope of the material described herein.

While the foregoing is directed to embodiments of the present invention, other and further embodiments of the invention may be devised without departing from the basic scope thereof, and the scope thereof is determined by the claims that follow.

What is claimed is:

1. A method, comprising:
    positioning a stage of a multiple-imaging unit digital lithography tool (DLT) so that a set of alignment marks provided on a substrate coupled to the stage are placed under a set of eyes of the DLT;
    for each alignment mark in the set:
        acquiring a first image using a camera coupled to the eye above it at a first time;

obtaining, from the first image, a first position of the alignment mark within the camera's FOV to determine a first measured position;

acquiring one or more additional images of the alignment mark at subsequent times and determining one or more corresponding subsequent measured positions; and respectively calculating differences between sequential ones of the measured positions;

and, based at least in part on the calculated differences for the set of alignment marks, creating a forecasting model to correct eye center drift for the set of eyes.

2. The method of claim 1, wherein each eye of the set of eyes defines a printing region of the substrate, and wherein one or more alignment marks is provided in each printing region.

3. The method of claim 2, wherein two or four alignment marks are provided in each printing region.

4. The method of claim 1, wherein the position of the alignment mark within the camera's FOV is obtained using image processing.

5. The method of claim 1, wherein the measured position and the subsequent measured positions within the camera's FOV are each expressed in terms of a co-ordinate system of the stage.

6. The method of claim 1, wherein the multiple imaging unit DLT comprises at least one bridge, and a bridge comprises two or more eyes.

7. The method of claim 1, wherein the set of eyes includes all of the eyes of the multiple-imaging unit DLT.

8. The method of claim 7, further comprising prior to performing a scan of the substrate, applying a digital correction to a set of patterns to be printed in the scan based on the forecasting model.

9. The method of claim 1, further comprising generating a global linear alignment model to correct between one scan and a next scan of the substrate, and further comprising creating the forecasting model from residual data for each eye relative to the global linear alignment model.

10. The method of claim 9, wherein the forecasting model is a moving average of eye center residual data for N prior scans of the DLT.

11. The method of claim 10, wherein the moving average is a weighted moving average of the eye center residual data for the N prior scans that more heavily weights data from more recent scans.

12. A method, comprising:
positioning a substrate to place a set of alignment marks of the substrate under a set of eyes of a multiple imaging unit DLT;
for each alignment mark in the set:
acquiring an image of the alignment mark with a camera coupled to an eye above it;
obtaining a position of the alignment mark within the camera's field of view (FOV) and determining its measured position; and
calculating a difference between its measured position and its nominal position; and
based at least in part on the differences, creating an optimized alignment model to transform the nominal positions of the alignment marks to their measured positions.

13. The method of claim 12, wherein the differences between the measured positions and the nominal positions arise from thermal conditions or mechanical effects.

14. The method of claim 12, wherein the alignment model contains shift, scale and rotation terms in each of two dimensions of the substrate.

15. The method of claim 14, wherein creating the optimized alignment model further comprises:
defining a merit function that calculates overall root mean square error between the measured positions and corresponding positions predicted by one or more possible alignment models; and
minimizing the merit function to obtain the optimized alignment model.

16. A system, comprising:
a processor; and
a memory, wherein the memory includes an application program configured to perform an operation for outputting a forecast of eye center variation for an eye of a multiple imaging unit DLT based on historical data, the operation comprising:
obtaining historical eye center variation data for the eye for N most recently printed plates;
inputting the historical eye center variation data into a forecasting model for the DLT;
receiving, as an output of the model, a correction forecast for the eye; and
applying the correction forecast for the eye to a printing region of the eye in a currently printing plate of the DLT.

17. The system of claim 16, wherein N is between 3 and 5.

18. The system of claim 16, wherein the forecasting model is a moving average of the eye center variation data for N prior plates.

19. The system of claim 18, wherein the moving average is a weighted moving average of the eye center residual data for the N prior scans that more heavily weights data from more recent scans.

20. The system of claim 16, wherein the historical eye center variation data for N prior plates is stored in a buffer, and wherein the buffer has a fixed size defined by the N plates and a number of eyes of the DLT, and wherein the buffer is a first-in-first-out (FIFO) buffer.

* * * * *